United States Patent
Murthy et al.

(10) Patent No.: US 6,373,112 B1
(45) Date of Patent: Apr. 16, 2002

(54) POLYSILICON-GERMANIUM MOSFET GATE ELECTRODES

(75) Inventors: Anand Murthy; Robert S. Chau, both of Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/454,056

(22) Filed: Dec. 2, 1999

(51) Int. Cl.⁷ ............................................. H01L 29/76
(52) U.S. Cl. ........................ 257/407; 257/413; 438/592
(58) Field of Search ............................... 438/279, 283, 438/300, 305, 514, 585, 588, 592, 597; 257/381, 385, 407, 616

(56) References Cited

U.S. PATENT DOCUMENTS 5,998,289 A * 12/1999 Yu .............................. 438/592
6,127,216 A * 10/2000 Yui ............................. 438/238
6,180,499 B1 * 1/2001 Yu .............................. 438/585

* cited by examiner

*Primary Examiner*—David Nelms
*Assistant Examiner*—Dung A Le
(74) *Attorney, Agent, or Firm*—Blakely, Sokoloff, Taylor & Zafman LLP

(57) ABSTRACT

An insulated gate field effect transistor (FET) of a particular conductivity type, has as a gate electrode including a polycrystalline SiGe layer. A process in accordance with the present invention includes forming an ultra-thin silicon seed film superjacent a gate dielectric layer followed by forming a SiGe layer over the seed layer. The thin Si seed layer enables deposition of the SiGe film to be substantially uniform and continuous without significant gate oxide degradation. The small thickness of the seed layer also enables effective Ge diffusion into the Si seed layer during subsequent deposition and/or subsequent thermal operations, resulting in a homogenous Ge concentration in the seed film and the SiGe overlayer.

10 Claims, 5 Drawing Sheets

602

FORM A DIELECTRIC LAYER LESS THAN 20 ANGSTROMS THICK
ON A SUBSTRATE

604

FORM A NANOCRYSTALLINE SILICON SEED LAYER OVER
THE DIELECTRIC LAYER

606

FORM A POLYCRYSTALLINE SiGe LAYER OVER THE SEED LAYER

FIG. 6

702 — FORM A DIELECTRIC LAYER LESS THAN 20 ANGSTROMS THICK ON A SUBSTRATE

704 — FORM A NANOCRYSTALLINE SILICON SEED LAYER OVER THE DIELECTRIC LAYER

706 — FORM A POLYCRYSTALLINE SiGe LAYER OVER THE SEED LAYER

708 — FORM A CAPPING LAYER OVER THE SiGe LAYER

710 — PATTERN CAPPING LAYER AND SiGe LAYER TO FORM GATE ELECTRODE

712 — FORM SOURCE/DRAIN TERMINALS ALIGNED WITH GATE ELECTRODE

POLYSILICON-GERMANIUM MOSFET GATE ELECTRODES

BACKGROUND OF THE INVENTION

1. Field of the Invention

The present invention relates generally to semiconductor structures and manufacturing. More particularly the invention relates to the formation of polycrystalline silicon germanium gate electrodes for metal-oxide-semiconductor field effect transistors (MOSFETs).

2. Background

Advances in semiconductor manufacturing technology have led to the integration of tens, and more recently, hundreds of millions of circuit elements, such as transistors, on a single integrated circuit (IC). In order to achieve such increases in density, not only have interconnect line widths become smaller, but so have the dimensions of metal-oxide-semiconductor field effect transistors.

MOSFETs are also sometimes referred to as insulated gate field effect transistors (IGFETs). Most commonly, theses devices are referred to simply as FETs, and are so referred to in this disclosure.

Transistor scaling typically involves more than just the linear reduction of the FET width and length. For example, both source/drain (S/D) junction depth and gate insulator thickness are also typically reduced in order to produce a FET with the desired electrical characteristics.

As is well known, the gate electrode of a FET is commonly formed from a patterned layer of polycrystalline silicon. Polycrystalline silicon is also referred to polysilicon. The polysilicon gate electrodes are commonly doped such that the gate electrodes of n-channel FETs (NFETs) are n-type, and the gate electrodes of p-channel FETs (PFETs) are p-type.

Since doped polysilicon is a semiconductive material, it tends to experience the formation of a depletion region adjacent to the interface between the gate electrode and the gate insulator (also referred to as the gate dielectric) when a voltage is applied to the gate electrode. As transistor scaling has substantially reduced the thickness of the gate insulator layer, the width of the depletion region in the doped polysilicon gate electrode has come to play a more significant role in determining the electrical characteristics of the FET. Unfortunately, the occurrence of this depletion region in the gate electrode tends to degrade transistor performance.

What is needed is a gate electrode structure that substantially overcomes the problems associated with polysilicon depletion layers, and methods of making such a gate electrode structure.

SUMMARY OF THE INVENTION

Briefly, a substantially continuous, and smooth, polycrystalline silicon germanium layer overlying a very thin layer of dielectric material is obtained by first forming a silicon seed layer over the dielectric layer.

In a particular embodiment, a MOSFET has a gate electrode that includes a polycrystalline SiGe layer superjacent to a gate dielectric layer, where the gate dielectric is less than about 20 angstroms in thickness.

BRIEF DESCRIPTION OF THE DRAWINGS

FIG. 6 is a flow diagram of a process in accordance with the present invention.

FIG. 7 is a flow diagram of a process in accordance with the present invention.

DETAILED DESCRIPTION

Terminology

Figure 1:
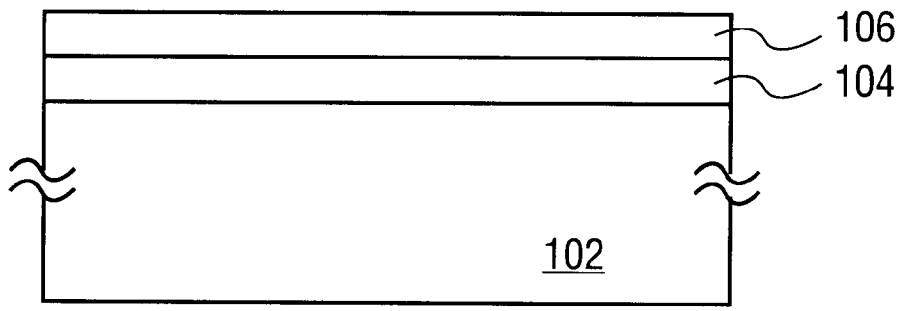
FIG. 1 is a schematic cross-sectional view of a dielectric layer and a silicon seed layer formed over a wafer.

The terms, chip, integrated circuit, monolithic device, semiconductor device or component, microelectronic device or component, and similar expressions, are often used interchangeably in this field. The present invention is applicable to all the above as they are generally understood in the field.

Historically, the material most commonly used in the semiconductor industry to form the gate insulator layer of a FET is silicon dioxide. Thus the gate insulator layer is frequently referred to simply as the gate oxide. The expression gate dielectric is also used to describe the gate insulator layer. Those skilled in the art will appreciate that gate dielectric layers may also be formed from a variety of materials, thicknesses, or multiple layers of material. By way of illustration and not limitation, gate dielectric layers may include oxide/nitride stacks, nitrided oxides of silicon, other oxides such as for example hafnium oxide, of other dielectric materials with electrical properties suitable for use as a MOSFET gate dielectric layer.

The term "gate" is context sensitive and can be used in two ways when describing integrated circuits. Gate refers to a circuit for realizing an arbitrary logical function when used in the context of a logic gate. However, as used herein, gate refers to the insulated gate terminal of a three terminal FET when used in the context of transistor circuit configurations or formation of transistor structures. The expression "gate terminal" is generally interchangeable with the expression "gate electrode". A FET can be viewed as a four terminal device when the semiconductor body is considered, for the purpose of describing illustrative embodiments of the present invention, the FET will be described using the traditional gate-drain-source, three terminal model.

Polycrystalline silicon is a nonporous form of silicon often formed by chemical vapor deposition from a silicon source gas or other methods and has a structure that contains crystallites or domains with large-angle grain boundaries, twin boundaries, or both. Polycrystalline silicon is often referred to in this field as polysilicon, or sometimes more simply as poly.

Poly depletion effect is an expression that has come to refer to the carrier depletion effect observed in gate electrodes formed from semiconductive materials, such as doped polysilicon.

Source/drain terminals refer to the terminals of a FET, between which conduction occurs under the influence of an electric field, subsequent to the inversion of the semiconductor surface under the influence of a vertical electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Circuit designers often designate a particular source/drain terminal to be a "source" or a "drain" on the basis of the voltage to be applied to that terminal when the FET is operated in a circuit.

In conventional FETs, polysilicon is used as the gate electrode material. The polysilicon is typically doped to be p-type or n-type, using operations such as ion implantation or thermal diffusion. It has been found that polysilicon gate electrodes of FETs exhibit a carrier depletion effect that degrades the electrical performance of the transistor.

The carrier depletion effect in polysilicon gate electrodes, also referred to as the poly depletion effect, occurs when an applied electric field sweeps away carriers so as to create a region in the doped polysilicon where the non-mobile dopant atoms become ionized. In n-doped polysilicon the depletion layer includes ionized non-mobile donor sites, whereas in p-doped polysilicon the depletion layer includes ionized non-mobile acceptor sites. This depletion effect results in a reduction in the strength of the expected electric field at the surface of the semiconductor when a voltage is applied to the gate electrode. The reduced electric field strength adversely affects transistor performance.

The use of thinner gate insulators, will tend to make the carrier depletion effect on device degradation even worse. With thinner gate oxides, the polysilicon gate depletion layer will become significant in dimension when compared to the gate oxide thickness and therefore reduce device performance. Typical depletion layer width in doped polysilicon gate electrodes is believed to be in the range of approximately 10 to 40 angstroms. This carrier depletion effect in the gate electrode limits device scalability by imposing a lower bound on how much the effective gate insulator thickness of the FET can be reduced. In other words, the depletion layer in the gate electrode effectively moves the gate electrode further from the surface of the semiconductor and therefore makes it more difficult for the applied electric field to create an inversion layer at the surface of the semiconductor.

Additionally, as gate oxide layers become thinner, e.g., less than or equal to approximately 15 angstroms, boron penetration into the gate oxide as a result of outdiffusion from boron-doped polysilicon is problematic.

It has recently been found that the use of silicon-germanium (SiGe) can alleviate the above described problems to some extent. However, depositing a layer of SiGe on ultra-thin gate oxides is exceedingly difficult, as it tends to be discontinuous, rough and non-uniform.

The problem of obtaining a smooth and continuous SiGe film on ultra-thin oxides of silicon is overcome in embodiments of the present invention by depositing a multi-layer stack of a very thin nanocrystalline Si seed film, followed by a SiGe film. Typically, a polysilicon capping layer is formed over the SiGe layer. The Si seed layer enables the formation of a substantially uniform SiGe layer having reduced roughness compared to conventionally formed SiGe layers on ultra-thin oxides of silicon. Also, by having the Si seed layer be very thin, homogenization of Ge with the Si seed layer by outdiffusion from the SiGe overlayer could possibly occur during subsequent thermal anneal operations, thereby achieving the objective of having SiGe at the interface with the gate oxide layer. Furthermore, the gate oxide quality is not significantly degraded by processes embodying the present invention because depositing a Si seed layer prior to formation of the SiGe layer, substantially prevents exposure of the gate oxide to gas mixtures containing $GeH_4$. In other words, $GeH_4$ cannot flow over the gate oxide layer because the gate oxide layer is covered by the Si seed film.

Illustrative Structure

Figure 5:
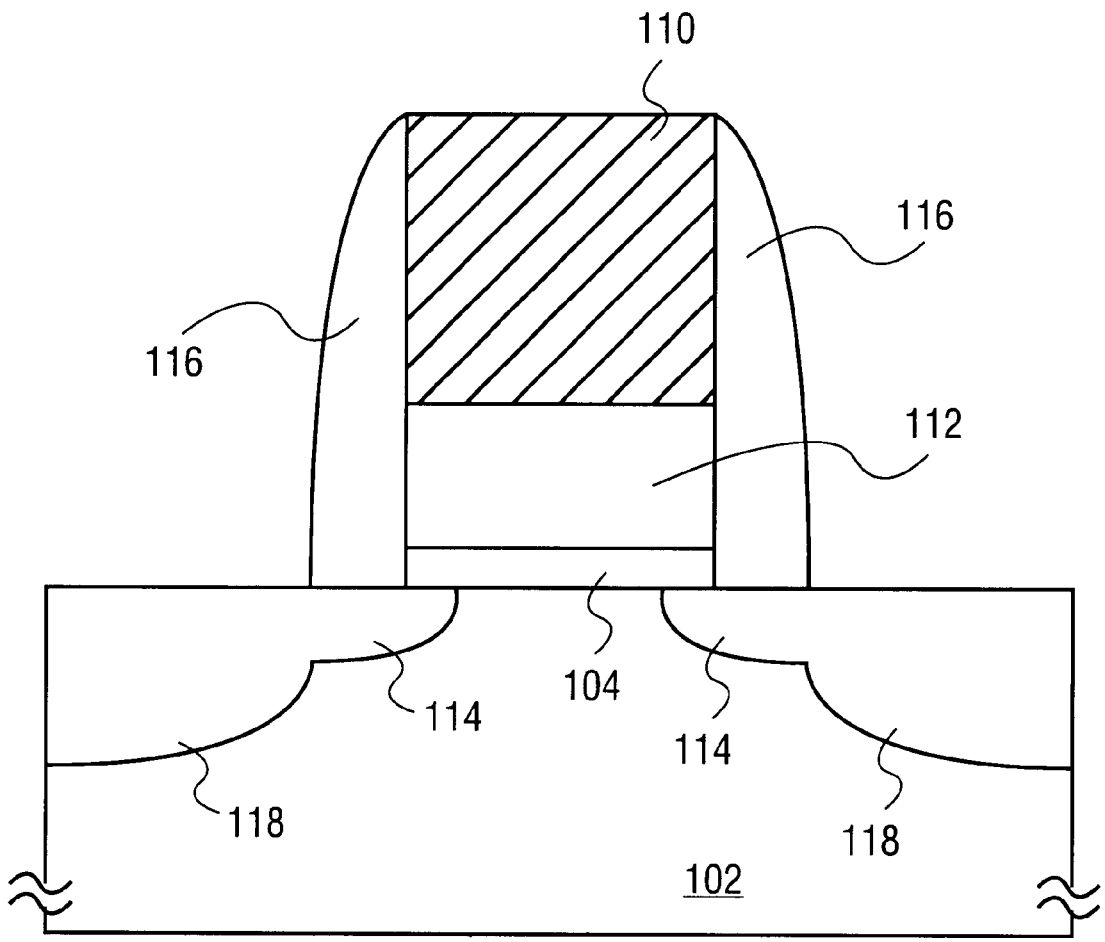
FIG. 5 is a schematic cross-sectional view of a MOSFET having a gate electrode in accordance with the present invention.

FIG. 5 shows a MOSFET having a gate electrode in accordance with the present invention. More particularly, FIG. 5 shows a silicon substrate 102, with a gate oxide 104 disposed on a surface thereof, a substantially continuous polycrystalline SiGe layer 112 disposed over gate oxide 104, a polycrystalline silicon layer 110 disposed over polycrystalline SiGe layer 112, sidewall spacers 116 disposed adjacent to sidewalls of the gate electrode, source/drain extensions 114 disposed in substrate 102 in alignment with the gate electrode as shown, and deep source/drain terminals 118 in alignment with sidewall spacers 116 as shown in the figure. In the illustrative embodiment gate oxide 104 is approximately 15 angstroms thick.

Those skilled in the art and having the benefit of this disclosure will appreciate that the present invention is not limited in use to the structure illustrated in FIG. 5. For example, structural elements including, but not limited to, multiple layer sidewall spacers, silicided source/drain terminals, silicided gate electrode, and shallow isolation trenches, may or may not be used in MOSFETs of the present invention. Similarly, the present invention may be used with MOSFETs having raised source/drains, and with MOSFETs having source/drains that are formed by a selective silicon deposition (sometimes referred to as backfilled source/drains).

Illustrative Process Flow

Illustrative embodiments of the present invention are described in conjunction with FIGS. 1–7. More particularly, the structures obtained via various processing operations are shown in FIGS. 1–5, and flow diagrams of processes that enable the fabrication of FETs with polycrystalline SiGe gate layers are shown in FIGS. 6–7.

FIG. 1 shows a wafer 102 having a gate dielectric layer 104 formed on the surface thereof. In this illustrative embodiment, gate dielectric 104 is an oxide of silicon. It is common in this field to refer to a gate dielectric, which is formed of an oxide of silicon, as a gate oxide. However, those skilled in the art and having the benefit of this disclosure will recognize, as discussed above, that a gate dielectric layer may be made of other materials or combinations of materials. In any case, since the Si seed layer is compatible with many dielectric structures and compositions, further details of gate dielectric formation are omitted here. Following the formation of gate oxide 104, a thin Si layer 106 is deposited at a temperature between approximately 600–675° C. at approximately atmospheric pressure using $SiH_4$ based chemistry with $H_2$ as the carrier gas. The deposition rate is controlled by using low $SiH_4$ flows, typically in the range of 10–30 sccm (standard cubic centimeters per minute). In one particular embodiment of the present invention, deposition of a very thin and highly nanocrystalline Si seed film has been achieved at a temperature of approximately 600° C. with a flow of approximately 20 sccm of $SiH_4$ and a carrier gas flow of approximately 10 slm (standard liters per minute) of $H_2$. This provides a deposition rate of approximately 32 angstroms per minute for the seed layer.

Figure 2:
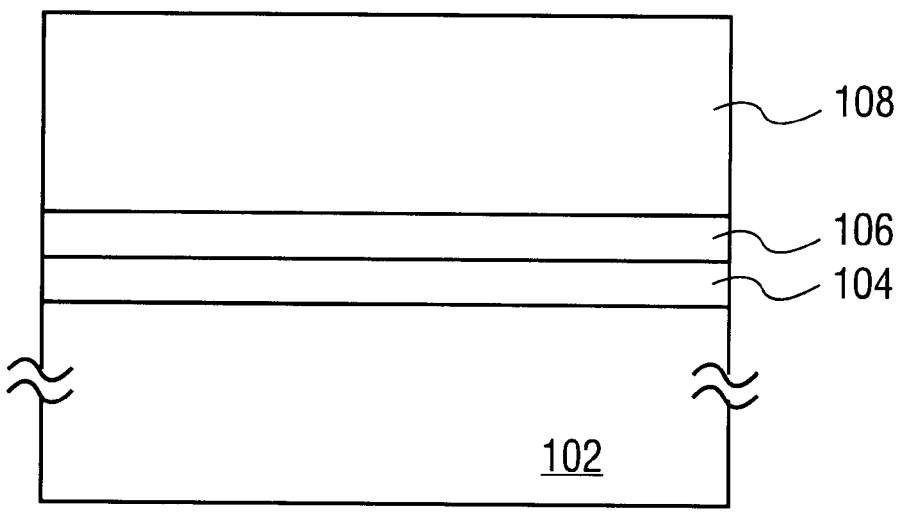
FIG. 2 is a schematic cross-sectional view of the structure of FIG. 1, after a SiGe layer has been formed over the silicon seed layer.

Subsequent to the deposition of Si seed layer 106, a polycrystalline SiGe layer 108 is deposited, as can be seen in FIG. 2, with a thickness in the range of 100–500 angstroms using silane and germane as the source gases. The deposition conditions include a temperature in the range of 600–700° C., a gas flow rate in the range of 50–150 sccm for silane and 10–200 sccm for germane with an $H_2$ carrier gas. The concentration of germane in the deposited polycrystalline SiGe layer 108 is principally controlled by the germane flow rate. This provides a deposition rate of approximately 350 angstroms per minute for the polycrystalline SiGe.

Figure 3:
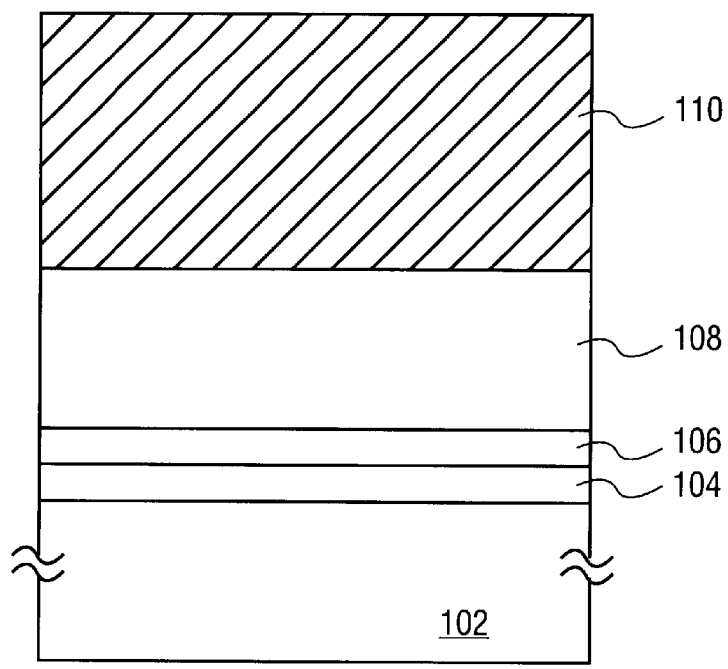
FIG. 3 is a schematic cross-sectional view of the structure of FIG. 2, after a polysilicon layer is formed over the SiGe layer.

Referring to FIG. 3, subsequent to the formation of polycrystalline SiGe layer 108, as described above, a capping layer 110 is typically formed over polycrystalline SiGe layer 108. In the illustrative embodiment, polycrystalline SiGe layer 108 is capped with a polycrystalline silicon layer 110 having a thickness in the range of approximately 1000–1500 angstroms. This polysilicon capping layer 110 can be formed by a deposition operation at a temperature in the range of 600–700° C., a silane flow rate in the range of 150–200 sccm, and an $H_2$ carrier gas flow of approximately 20 slm. This provides a deposition rate of approximately 320 angstroms per minute for the polysilicon layer.

With respect to the formation of the silicon seed layer, the polycrystalline SiGe layer, and the polysilicon overlayer, these operations can be performed in the same reaction chamber. In this illustrative embodiment the wafers are rotated in the reaction chamber at approximately 35 rpm. Rates of 20 rpm to 100 rpm may be used.

Figure 4:
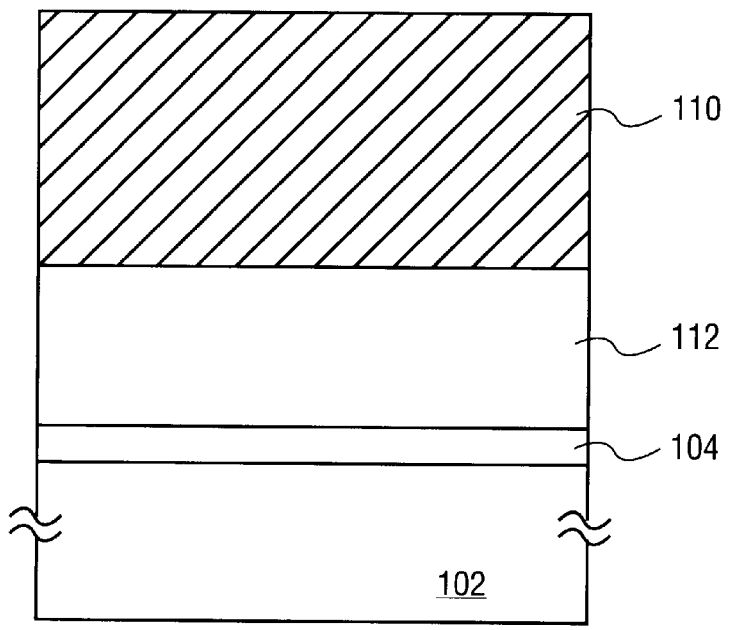
FIG. 4 is a schematic cross-sectional view of the structure of FIG. 3, after germanium diffuses from the SiGe layer into the silicon seed layer.

Referring now to FIG. 4, various layers included in the make-up of a MOSFET gate electrode in one embodiment of the present invention are shown. As shown in FIG. 2, a silicon wafer 102, has an oxide layer 104 superjacent thereto, a polycrystalline SiGe layer superjacent oxide layer 104, and polycrystalline layer 110 superjacent polycrystalline SiGe layer 112. In contrast to the stack shown in FIG. 3, there is no silicon seed layer 106. This is because Ge from polycrystalline SiGe layer 108 outdiffuses into silicon seed layer 106, thereby forming polycrystalline SiGe layer 112 which has a thickness substantially equal to the thickness of silicon seed layer 106 plus the thickness of polycrystalline SiGe layer 108. The outdiffusion may occur during the deposition of polycrystalline SiGe layer 108, and/or during various high temperature operations that occur subsequently in the processing operation used to form integrated circuits.

In an alternative embodiment of the present invention, a wafer with a gate dielectric layer formed thereon is placed in a reactions chamber and a continuous deposition process is performed wherein the gas mixture is changed from an initial mix containing essentially no Ge, to a gas mix containing a significant amount of Ge. In this way, rather than depositing a silicon seed layer followed by a SiGe layer, a continuous film is formed with a changing Ge concentration. It will be appreciated that the mix can be changed gradually or in a step-wise manner.

Having formed a stack of oxide, polycrystalline SiGe, and polycrystalline Si, on the wafer, FETs can then be formed by various well known processing operations. For example, the stack can be photolithographically patterned to produce gate electrodes, an ion implantation operation can be used to form source/drain extension regions self-aligned to the gate electrodes, sidewall spacers can be formed adjacent to the sides of the gate electrodes, and an ion implantation operation can be used to form deep source/drain regions self-aligned to the sidewall spacers. Those skilled in the art will recognize that silicidation may be performed on the source/drain terminals and the gate electrode, either singularly or in combination.

To form an integrated circuit containing both NFETs and PFETs in accordance with the present invention, conventional, semiconductor processing operations are performed upon a wafer up through the formation of the gate dielectric layer. A silicon seed layer is then formed, followed by the formation of a SiGe layer as described above. Polysilicon is then deposited over the SiGe. The stack of polysilicon, SiGe, silicon seed layer, and gate dielectric may then be patterned in accordance with a gate mask by conventional lithographic techniques, thereby forming a plurality of gate stacks. A first portion of the plurality of gate stacks is then covered, i.e., protected, with a masking layer, and a second portion of the plurality of gate stacks is further processed so as to form source/drain terminals of a first conductivity type. The masking layer over the first portion is removed and another masking layer is formed over the second portion of gate stacks, thereby exposing the first portion for further processing while protecting the second portion from further processing. The gate stacks of the first portion are then processed so as to form source/drain terminals of a second conductivity type. Those skilled in the art will recognize that the processing operations used to form transistors from the gate stacks, may include one or more ion implantations to form the source/drain terminals. The gate electrodes of the NFETs and the gate electrodes of the PFETs will have different work functions by virtue of different doping operations to which they are exposed.

Various other layers of insulators and conducting material are typically formed above the gate level, as is well understood in the field of semiconductor manufacturing and integrated circuit design. In this way, various circuit elements may be interconnected so as to provide the desired electrical functionality.

Referring to FIG. 6, a process embodying the present invention is described. A dielectric layer less than 20 angstroms in thickness is formed on a substrate (block 602). In this illustrative embodiment, the substrate is a silicon wafer, and the dielectric layer is an oxide of silicon. A nanocrystalline silicon seed layer is subsequently formed over the dielectric layer (block 604). Finally, a polycrystalline SiGe layer is formed over the seed layer (block 606).

Referring to FIG. 7, another process embodying the present invention is described. A dielectric layer less than 20 angstroms in thickness is formed on a substrate (block 702). In this illustrative embodiment, the substrate is a silicon wafer, and the dielectric layer is an oxide of silicon. A nanocrystalline silicon seed layer is subsequently formed over the dielectric layer (block 704). A polycrystalline SiGe layer is formed over the seed layer (block 706). A capping layer is subsequently formed over the polycrystalline SiGe layer (block 708). In this illustrative embodiment, the capping layer is polycrystalline silicon. The capping layer and polycrystalline SiGe layers are then patterned to form one or more gate electrodes (block 710). Subsequent to the patterning of the gate electrodes, source/drain terminals, substantially self-aligned to the gate electrodes are formed (block 712).

Conclusion

Embodiments of the present invention provide MOSFET gate electrodes having a substantially continuous and smooth silicon germanium layer superjacent a silicon oxide gate dielectric layer.

An advantage of embodiments of the present invention is the substantial elimination of transistor performance limitations caused by carrier depletion in conventional polysilicon gate electrodes.

The present invention may be implemented with various changes and substitutions to the illustrated embodiments. For example, the gate dielectric layer may be composed of a material other than, or in addition to, an oxide of silicon.

It will be readily understood by those skilled in the art and having the benefit of this disclosure, that various other changes in the details, materials, and arrangements of the materials and steps which have been described and illustrated in order to explain the nature of this invention may be made without departing from the principles and scope of the invention as expressed in the subjoined claims.

What is claimed is:

1. A field effect transistor, comprising:
    a gate dielectric layer disposed over a substrate;
    a gate electrode comprising a nanocrystalline silicon-seed film overlying the gate dielectric layer, a polycrystalline SiGe layer overlying the silicon-seed film, and a polysilicon layer overlying the polycrystalline SiGe layer; and
    a pair of source/drain terminals substantially disposed in the substrate, and in alignment with laterally opposed sidewalls of the gate electrode.

2. The field effect transistor of claim 1, wherein the polycrystalline SiGe layer is between approximately 100 and 500 angstroms thick.

3. The field effect transistor of claim 1, wherein the gate dielectric layer comprises an oxide of silicon.

4. The FET of claim 3, wherein the oxide has a thickness less than approximately 20 angstroms.

5. The FET of claim 1, wherein the SiGe has a proportion of Si and a proportion of Ge defined by the relation $Si_xGe_{100-x}$, and $50 \leq x \leq 100$.

6. The FET of claim 1, wherein the SiGe has a proportion of Si and a proportion of Ge defined by the relation $Si_xGe_{100-x}$, and $50 \leq x \leq 100$, and the gate dielectric comprises an oxide of silicon less than 20 angstroms thick.

7. The FET of claim 1, wherein the SiGe has a proportion of Si and a proportion of Ge defined by the relation $Si_xGe_{100-x}$, and $50 \leq x \leq 100$, the thickness of the polycrystalline silicon germanium layer is between approximately 100 and 500 angstroms, and the gate dielectric comprises an oxide of silicon less than 20 angstroms thick.

8. An integrated circuit, comprising:
    a substrate;
    a first FET of a first conductivity type formed on the substrate; and
    a second FET of a second conductivity type formed on the substrate;
    wherein the first FET has a first gate electrode comprising a nanocrystalline silicon-seed film, a polycrystalline SiGe layer overlying the silicon-seed film and a polycrystalline Si layer overlying the polycrystalline SiGe layer; and the second FET has a second gate electrode comprising a nanocrystalline silicon-seed film, a polycrystalline SiGe layer overlying the silicon-seed film and a polycrystalline Si layer overlying the polycrystalline SiGe layer; and
    wherein the silicon-seed film provides a continuous and smooth interface between the polycrystalline SiGe layer and the gate dielectric layer, and wherein the silicon-seed film is sufficiently thin to allow homogenization of Ge within the film during subsequent anneal operations.

9. The integrated circuit of claim 8, wherein a work function of the first gate electrode is different from a work function of the second gate electrode.

10. The integrated circuit of claim 8, wherein the gate dielectric layer is less than approximately 15 angstroms.

* * * * *